US012581612B2

(12) United States Patent
Kitamura et al.

(10) Patent No.: US 12,581,612 B2
(45) Date of Patent: Mar. 17, 2026

(54) CENTRIFUGAL FAN AND ELECTRONIC APPARATUS

(71) Applicant: Lenovo (Singapore) Pte. Ltd., Singapore (SG)

(72) Inventors: Masahiro Kitamura, Kanagawa (JP); Junki Hashiba, Kanagawa (JP); Shusaku Tomizawa, Kanagawa (JP); Takateru Adachi, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 267 days.

(21) Appl. No.: 18/450,405

(22) Filed: Aug. 16, 2023

(65) Prior Publication Data

US 2024/0121909 A1 Apr. 11, 2024

(30) Foreign Application Priority Data

Oct. 6, 2022 (JP) .................................. 2022-161806

(51) Int. Cl.
*H05K 7/20* (2006.01)
*F04D 17/16* (2006.01)
*F04D 29/42* (2006.01)

(52) U.S. Cl.
CPC ......... *H05K 7/20136* (2013.01); *F04D 17/16* (2013.01); *F04D 29/4226* (2013.01)

(58) Field of Classification Search
CPC .. H05K 7/20136; F04D 17/16; F04D 29/4226
See application file for complete search history.

(56) References Cited

U.S. PATENT DOCUMENTS

| | | | | | |
|---|---|---|---|---|---|
| 10,423,200 | B1 * | 9/2019 | North | ..................... | G06F 1/1616 |
| 2018/0238338 | A1 * | 8/2018 | Tamaoka | .............. | F04D 29/162 |

FOREIGN PATENT DOCUMENTS

| | | |
|---|---|---|
| JP | 2018-193892 A | 12/2018 |
| JP | 2022-117678 A | 8/2022 |

* cited by examiner

*Primary Examiner* — Mukundbhai G Patel
(74) *Attorney, Agent, or Firm* — Osha Bergman Watanabe & Burton LLP

(57) ABSTRACT

A centrifugal fan includes: a fan having a motor that rotates around a central axis, and a plurality of blades provided on an outer periphery of the motor; and a casing which accommodates the fan, and has an intake port provided in the axial direction of the central axis, and an exhaust port provided in a direction orthogonal to the central axis, wherein an end surface of each of the plurality of blades that faces the intake port is provided with an inclined portion that inclines such that a height thereof in the axial direction gradually decreases toward the motor, and the plurality of blades include a plurality of blade groups having different start point positions at which the inclined portions start to incline in a direction from the tips of the blades toward the motor.

5 Claims, 8 Drawing Sheets

CENTRIFUGAL FAN AND ELECTRONIC APPARATUS

CROSS-REFERENCE TO RELATED APPLICATIONS

The present application claims priority under 35 U.S.C. § 119 to Japanese Patent Application No. 2022-161806, filed Oct. 6, 2022. The contents of this application are incorporated herein by reference in their entirety.

BACKGROUND OF THE INVENTION

Field of the Invention

The present invention relates to a centrifugal fan and an electronic apparatus provided with the centrifugal fan.

Description of the Related Art

An electronic apparatus such as a laptop PC incorporates, inside a chassis thereof, a centrifugal fan for exhausting heat emitted from electronic components such as a CPU to the outside (refer to, for example, Japanese Unexamined Patent Application Publication No. 2022-117678).

SUMMARY OF THE INVENTION

There is a high demand for reducing the operation noise of such an electronic apparatus as described above. Therefore, a centrifugal fan is frequently controlled to operate with a constant noise level so as to prevent the centrifugal fan from generating more noise than expected. In other words, if the noise reduction of the centrifugal fan can be improved, it is possible to increase the rotation speed thereof. This would increase the air volume of the centrifugal fan, thus improving the cooling performance of the entire electronic apparatus.

One or more embodiments of the present invention provide a centrifugal fan capable of suppressing the generation of noise, and an electronic apparatus provided with the centrifugal fan.

A centrifugal fan according to the first aspect of the present invention includes: a fan having a motor section (motor) which rotates around a central axis and a plurality of blades provided on an outer periphery of the motor section; and a casing which accommodates the fan, has an intake port provided in an axial direction of the central axis and an exhaust port provided in a direction orthogonal to the central axis, wherein an end surface of each of the plurality of blades that faces the intake port is provided with an inclined portion that inclines such that a height thereof in the axial direction gradually decreases toward the motor section, and the plurality of blades include a plurality of blade groups having different start point positions at which the inclined portions start to incline in a direction from tips of the blades toward the motor section.

A centrifugal fan according to the second aspect of the present invention includes: a fan having a motor section that rotates around a central axis, and a plurality of blades provided on an outer periphery of the motor section; and a casing which accommodates the fan, and has an intake port provided in an axial direction of the central axis, and an exhaust port provided in a direction orthogonal to the central axis, wherein an end surface of each of the plurality of blades that faces the intake port is provided with an inclined portion that inclines such that a height thereof in the axial direction gradually decreases toward the motor section, and the plurality of blades include a plurality of blade groups in which lengths of the inclined portions in a direction from tips of the blades toward the motor section are different.

A centrifugal fan according to the third aspect of the present invention includes: a fan having a motor section that rotates around a central axis, and a plurality of blades provided on an outer periphery of the motor section; and a casing which accommodates the fan, and has an intake port provided in an axial direction of the central axis, and an exhaust port provided in a direction orthogonal to the central axis, wherein an end surface of each of the plurality of blades that faces the intake port is provided with an inclined portion that inclines such that a height thereof in the axial direction gradually decreases toward the motor section, and adjacent blades of the plurality of blades have different start point positions at which the inclined portions start to incline from tips of the blades toward the motor section.

An electronic apparatus according to the fourth aspect of the present invention is an electronic apparatus which is provided with a centrifugal fan having the above-described configuration, and which includes: a chassis; a heating element provided in the chassis; and a cooling module provided in the chassis to absorb heat generated by the heating element, wherein the cooling module includes the centrifugal fan, a fin placed facing the exhaust port, and a heat transport device that transports heat generated by the heating element to the fin.

The above-described aspects of the present invention can suppress the generation of noise.

DETAILED DESCRIPTION OF THE INVENTION

Embodiments of a centrifugal fan and an electronic apparatus according to the present invention will be described below in detail with reference to the accompanying drawings.

Figure 1:
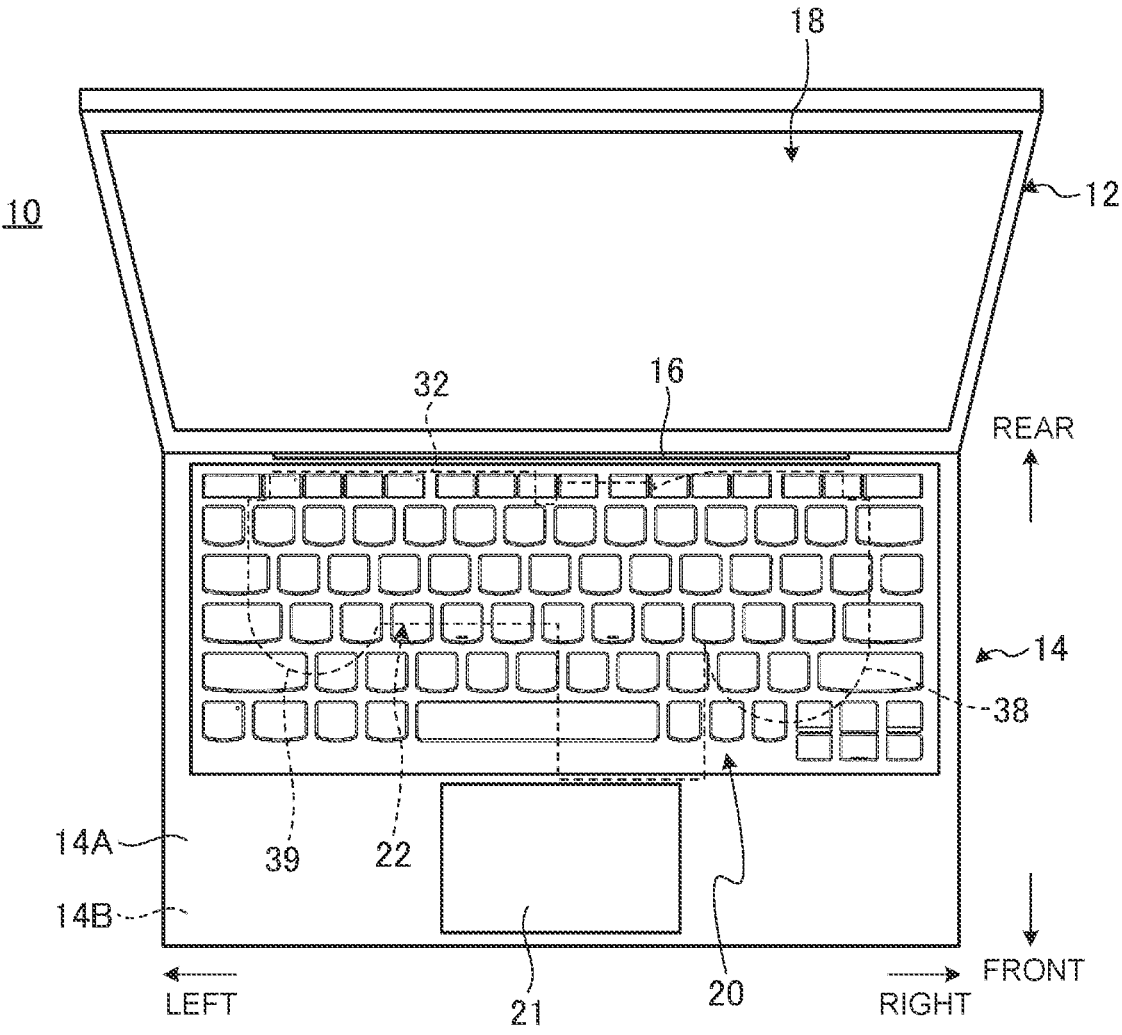
FIG. 1 is a schematic plan view of an electronic apparatus according to an embodiment observed from above.

FIG. 1 is a schematic plan view of an electronic apparatus 10 according to an embodiment observed from above. As illustrated in FIG. 1, the electronic apparatus 10 is a clamshell-type laptop PC having a display chassis 12 and a chassis 14 connected by hinges 16 in a relatively rotatable manner. The electronic apparatus according to one or more embodiments of the present invention may be, for example, a desktop PC, a tablet PC, a smartphone, or a game machine other than a laptop PC.

The display chassis 12 is a thin flat box body. The display chassis 12 has a display 18. The display 18 is composed of, for example an organic EL (OLED: Organic Light Emitting Diode) or a liquid crystal.

In the following description, regarding the chassis 14 and each element installed therein, the chassis 12 and 14 are placed in the opened state as illustrated in FIG. 1, and with the posture of viewing the display 18 defined as a reference, the front side will be referred to as front, the back side will be referred to as rear, the width direction will be referred to as left-right, and the height direction (the thickness direction of the chassis 14) will be referred to as top-bottom.

The chassis 14 is a thin flat box body. The chassis 14 is composed of a cover member 14A that forms the upper surface and the four peripheral side surfaces, and a cover member 14B that forms the bottom surface. The cover member 14A on the upper side has a substantially bathtub shape with an open bottom. The cover member 14B on the lower side has a substantially flat plate shape and serves as a cover body that closes the bottom surface opening of the cover member 14A. The cover members 14A and 14B are overlapped in the thickness direction and detachably connected to each other. A keyboard 20 and a touch pad 21 are provided on the upper surface of the chassis 14. The chassis 14 is connected to the display chassis 12 using the hinges 16 at the rear end thereof.

Figure 2:
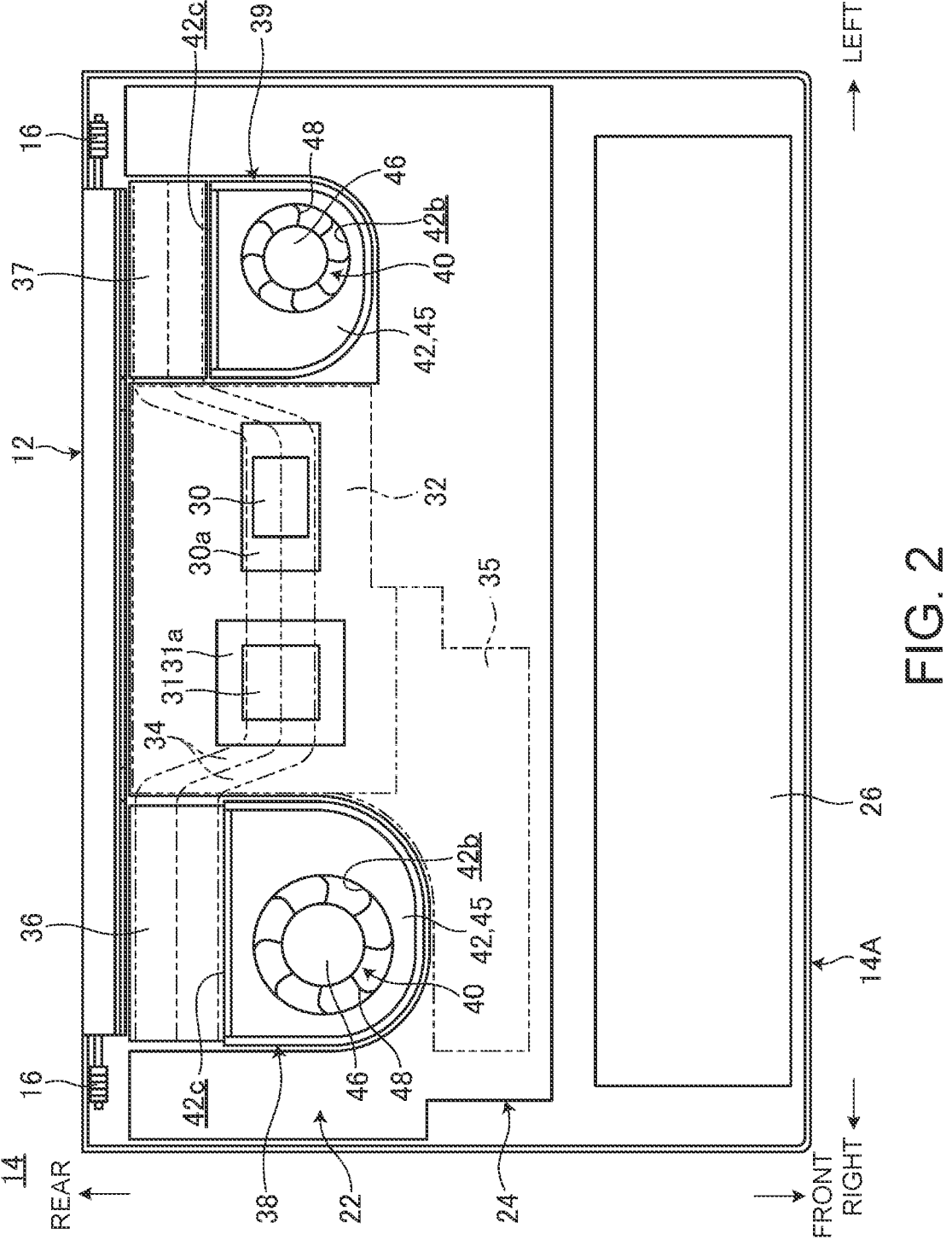
FIG. 2 is a bottom view schematically illustrating the internal structure of a chassis.

FIG. 2 is a bottom view schematically illustrating the internal structure of the chassis 14.

As illustrated in FIG. 2, a cooling module 22, a motherboard 24, and a battery device 26 are provided inside the chassis 14. Further, various electronic components, mechanical components, and the like are provided inside the chassis 14.

The motherboard 24 is a mainboard of the electronic apparatus 10. The motherboard 24 is placed closer to the rear of the chassis 14 and extends along the left-right direction. The motherboard 24 is a printed circuit board on which various electronic components such as memories, a communication module, and connection terminals in addition to a CPU 30 and a GPU 31 are mounted. The motherboard 24 is placed under the keyboard 20, and screwed to the rear surface of the keyboard 20 or the inner surface of the cover member 14A. In the case of the present embodiment, the upper surface of the motherboard 24 serves as the surface to be attached to the cover member 14A, while the lower surface thereof serves as the surface on which the CPU 30 and the like are mounted (refer to FIG. 2).

The CPU 30 performs calculation related to the main control and processing of the electronic apparatus 10. The GPU 31 performs calculations necessary for image depiction such as 3D graphics. Symbol 30a in FIG. 2 denotes a package substrate on which the die of the CPU 30 is mounted. Similarly, symbol 31a denotes a package substrate on which the die of the GPU 31 is mounted.

The battery device 26 is a rechargeable battery serving as the power source of the electronic apparatus 10. The battery device 26 is placed in front of the motherboard 24 and extends to left-right along the front edge of the chassis 14.

The configuration of the cooling module 22 will now be described.

The CPU 30 and the GPU 31 are heat generating elements that generate the largest amount of heat among the electronic components installed in the chassis 14. Therefore, the cooling module 22 absorbs and diffuses the heat generated by the CPU 30 and the GPU 31, and further discharges the heat to the outside of the chassis 14. The cooling module 22 is stacked so as to cover a part of the mounting surface of the motherboard 24, specifically the range where the CPU 30 and the GPU 31 are mounted.

As illustrated in FIG. 2, the cooling module 22 includes a vapor chamber 32, heat pipes 34, a pair of left and right heat sinks 36, 37, and a pair of left and right centrifugal fans 38, 39.

The vapor chamber 32 is a plate-type heat transport device. The vapor chamber 32 is formed by forming a hermetically sealed space containing a wick between two thin metal plates and by enclosing a working fluid in this hermetically sealed space. The working fluid circulates while undergoing a phase change in the hermetically sealed space, thus enabling highly efficient heat transport. The vapor chamber 32 absorbs and diffuses the heat of the CPU 30 and the GPU 31, and transmits the heat to the heat pipes 34 connected to the lower surface thereof. FIG. 2 illustrates, by two-dot chain lines, the vapor chamber 32, the heat pipes 34, and a metal plate 35 stacked to the lower surface side of the motherboard 24.

The heat pipes 34 are pipe-type heat transport devices. The heat pipes 34 are connected to the lower surface of the vapor chamber 32 at positions where the heat pipes 34 overlap with the CPU 30 and the GPU 31 in the top-bottom direction. The present embodiment exemplifies a configuration in which two heat pipes are arranged side by side in pairs at front and rear, and both ends of the heat pipes are connected to the left and right heat sinks 36, 37. The number of the heat pipes 34 may be one or three or more. The heat pipes 34 are formed by crushing metal pipes into a thin and flat shape to form elliptical cross-sections, placing wicks in hermetically sealed spaces in the metal pipes, and enclosing a working fluid therein. The working fluid circulates while undergoing a phase change in the hermetically sealed space, thus enabling highly efficient heat transport.

Symbol 35 in FIG. 2 denotes a thin metal plate made of aluminum, copper or the like and connected to the front edge of the vapor chamber 32. The metal plate 35 is provided in such a manner as to cover, for example, a power component or the like mounted on the motherboard 24.

The heat sinks 36, 37 have a structure in which a plurality of plate-like fins are arranged at regular intervals in the left-right direction. Each fin is a thin plate made of a metal having high thermal conductivity, such as aluminum or copper. Each fin stands in the top-bottom direction and extends in the front-rear direction. Between adjacent fins, gaps are formed through which air sent from the centrifugal fans 38, 39 passes. Heat transport devices other than the heat pipes 34, such as the vapor chamber 32 or a heat spreader serving as an alternative thereof, may be connected to the heat sinks 36, 37.

The centrifugal fans 38, 39 will now be described.

Figure 3:
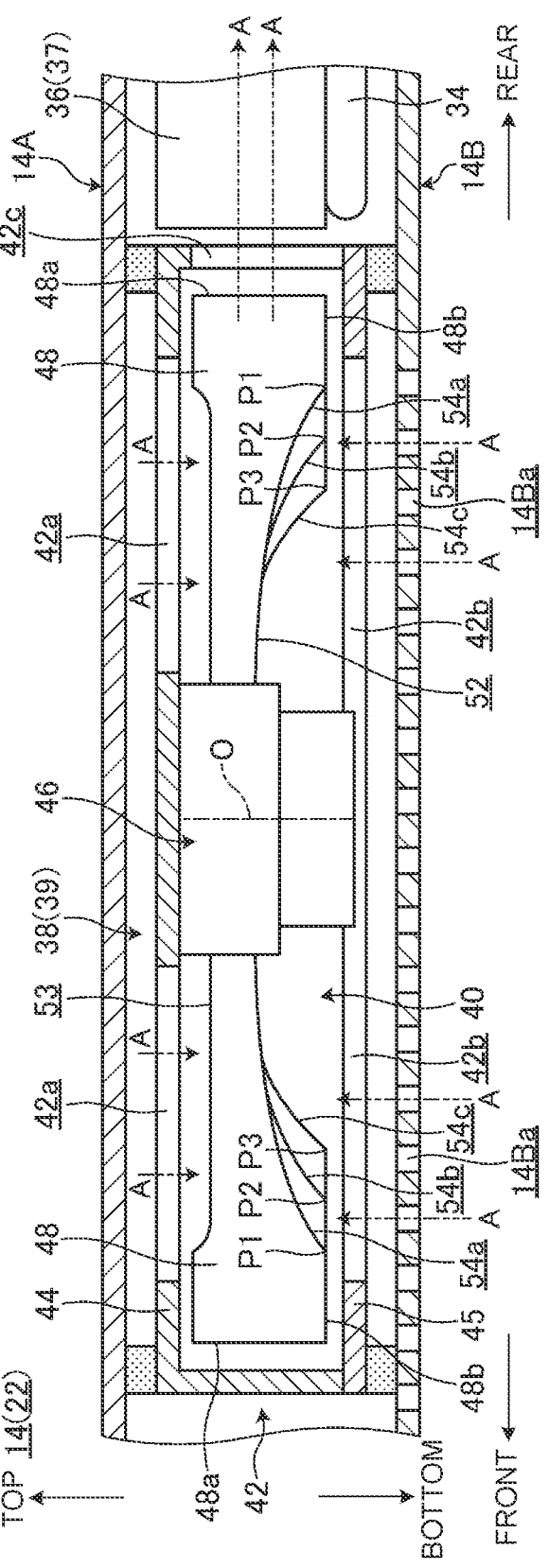
FIG. 3 is a schematic side sectional view of the chassis.

FIG. 3 is a schematic side sectional view of the chassis 14, illustrating the centrifugal fan 38 and the surroundings thereof in an enlarged view. The left and right centrifugal fans 38, 39 have slightly different sizes, but may have the same basic configuration. Therefore, one centrifugal fan 38 will be representatively described below, and the other centrifugal fan 39 will be assigned the same symbols as those of the components of the centrifugal fan 38 in the drawings, and detailed descriptions thereof will be omitted. One of the centrifugal fans 38, 39 may be omitted.

As illustrated in FIG. 2 and FIG. 3, the centrifugal fan 38 includes a fan 40 and a casing 42.

The casing 42 is composed of a frame 44 surrounding the upper portion and the outer peripheral side surface of the fan 40, and a cover plate 45 surrounding the lower portion of the fan 40. The top and bottom of the casing 42 may be reversed.

An intake port 42a is formed in the frame 44, and an intake port 42b is formed in the cover plate 45. The intake ports 42a, 42b are, for example, ring-shaped openings. The intake ports 42a, 42b are provided, surrounding a motor section 46, which will be described later, in a plan view, and facing the end surfaces of blades 48. Chassis intake ports 14Ba formed in the cover member 14B face directly below the intake port 42b on the lower surface side. The chassis intake ports 14Ba open in the bottom surface of the chassis 14.

Further, an exhaust port 42c is formed in the rear side surface of the frame 44. The exhaust port 42c of the centrifugal fan 38 faces the front surface of the heat sink 36, and the exhaust port 42c of the centrifugal fan 39 faces the front surface of the heat sink 37. A chassis exhaust port that opens at the rear surface of the chassis 14 faces immediately behind the heat sinks 36, 37.

Figure 4:
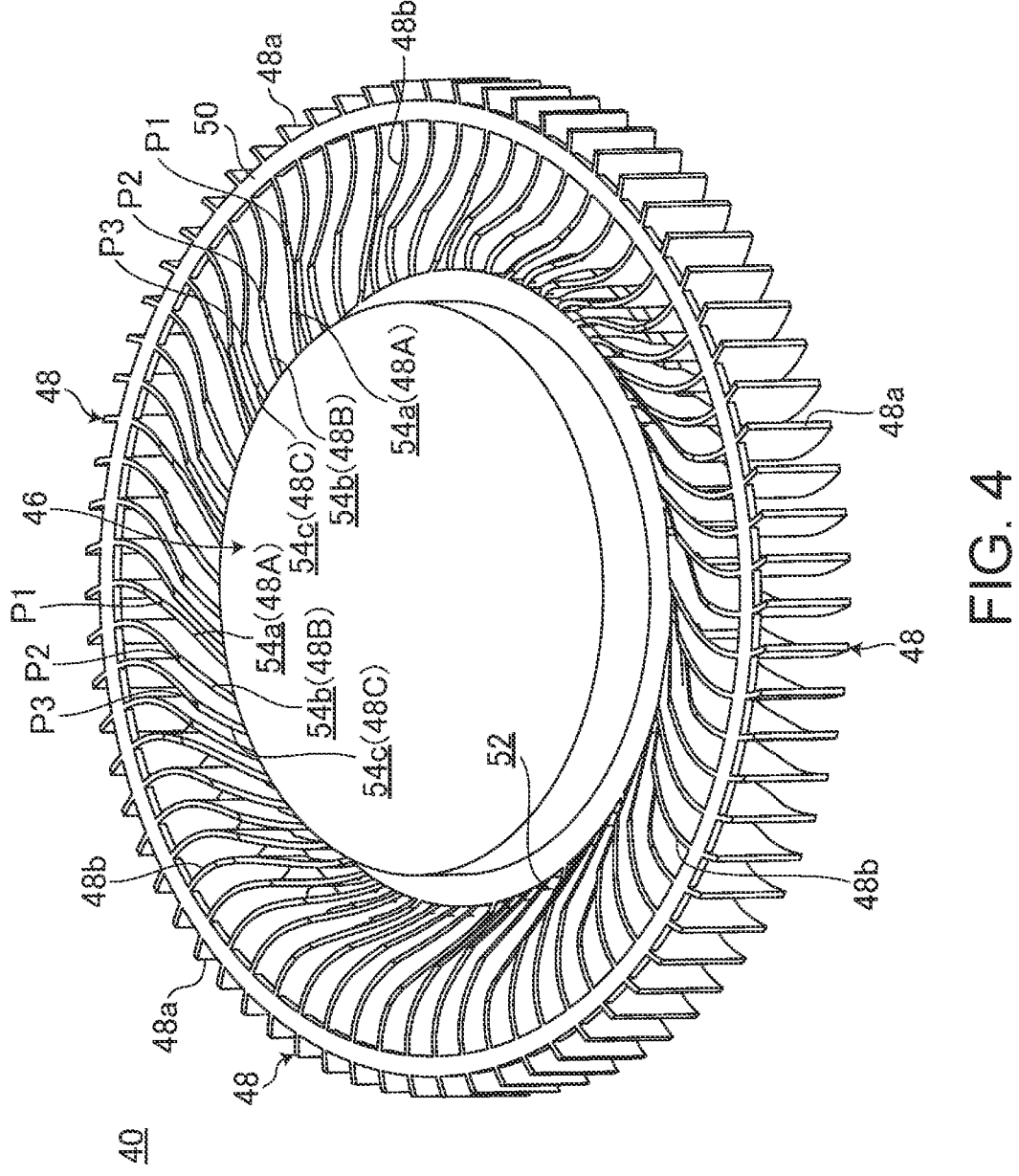
FIG. 4 is a perspective view of a fan.
Figure 5:
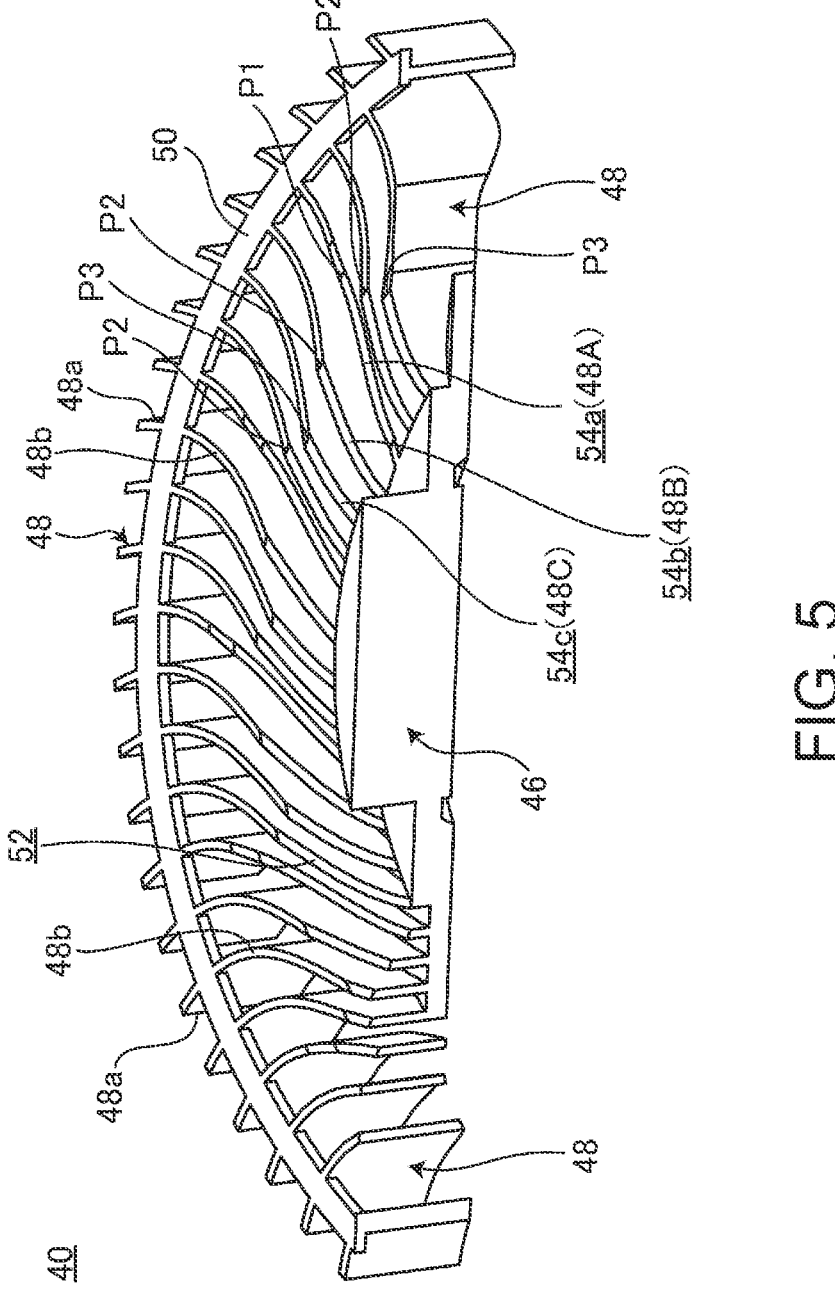
FIG. 5 is an enlarged perspective view of a part of the fan illustrated in FIG. 4.
Figure 6:
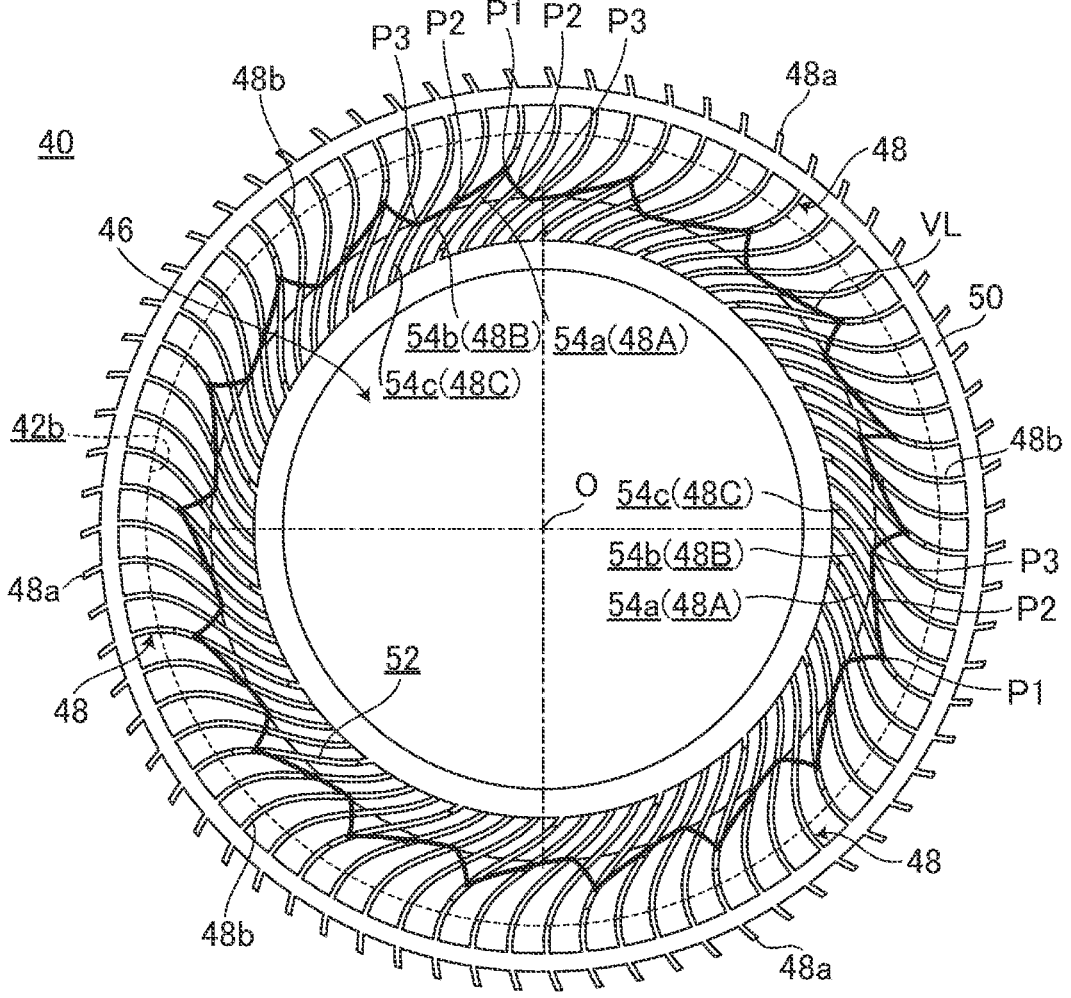
FIG. 6 is a plan view of the fan.

FIG. 4 is a perspective view of the fan 40. FIG. 5 is an enlarged perspective view of a part of the fan 40 illustrated in FIG. 4. FIG. 6 is a plan view of the fan 40. As illustrated in FIG. 3 to FIG. 6, the fan 40 has the motor section 46 and the plurality of blades 48.

The motor section 46 has a motor accommodated in a cylindrical hub, and rotates about a central axis O thereof. The blades 48 radially protrude from the outer peripheral side surface of the motor section 46. The blades 48 are curved in a substantially S-shape in a plan view from the bases thereof adjacent to the motor section 46 toward tips 48a thereof. The blades 48 may have a curved shape other than the S shape or a straight shape. The blades 48 are connected to and reinforced by a ring-shaped ring plate 50 at the portions thereof slightly offset from the tips 48a toward the root side. In the case of the present embodiment, the hub of the motor section 46, the blades 48, and the ring plate 50 are integrally formed using, for example, a resin material. At least one of the hub, the blades 48, and the ring plate 50 may be formed of a metal material.

In the cooling module 22 described above, the heat generated by the CPU 30 and the GPU 31 is absorbed and diffused by the vapor chamber 32, transmitted to the heat pipes 34, and transported to the heat sinks 36, 37. Further, in the cooling module 22, air A taken in through the intake ports 42a, 42b of the centrifugal fans 38, 39 and exhausted through the exhaust port 42c passes through the heat sinks 36, 37, and is exhausted out of the chassis 14 (refer to FIG. 3). This enables the cooling module 22 to efficiently cool the CPU 30 and the GPU 31.

In the meanwhile, the centrifugal fan 38 (39) installed in the electronic apparatus 10, which is, for example, a laptop PC, is normally controlled to operate with a constant noise value. This is to suppress, to an allowable range, the noise generated by the centrifugal fans 38, 39, which are the largest noise sources among the components installed in the electronic apparatus 10, thereby ensuring the quietness of the apparatus as a whole. In other words, if the quietness of the centrifugal fans 38, 39 is improved, the rotation speed can be increased, and the cooling performance is expected to be improved by an increased air volume.

A description will now be given of the configuration for reducing the noise of the centrifugal fans 38, 39. Again, one centrifugal fan 38 will be representatively described.

As illustrated in FIG. 3 to FIG. 6, the centrifugal fan 38 has a recessed portion 52 in which the entire assembly of the blades 48 is recessed like a mortar on the inner side of the intake port 42b. The recessed portion 52 is a portion for improving the efficiency of air intake through the intake port 42b by the fan 40. Although the shape is different, a recessed portion 53 formed by concaving the entire assembly of the blades 48 is also provided on the inner side of the intake port 42a (refer to FIG. 3).

End surfaces 48b of the blades 48, which face the intake port 42b, have inclined portions 54a to 54c that are curved and inclined toward the root (toward the motor section 46) from the tips 48a. As illustrated in FIG. 3 to FIG. 5, the inclined portions 54a to 54c are curved and inclined so as to gradually decrease the height of the blades 48 from the tips to the roots of the blades 48, with the root being the lowest. These inclined portions 54a to 54c form the recessed portion 52 of the blades 48 as a whole.

Figure 7:
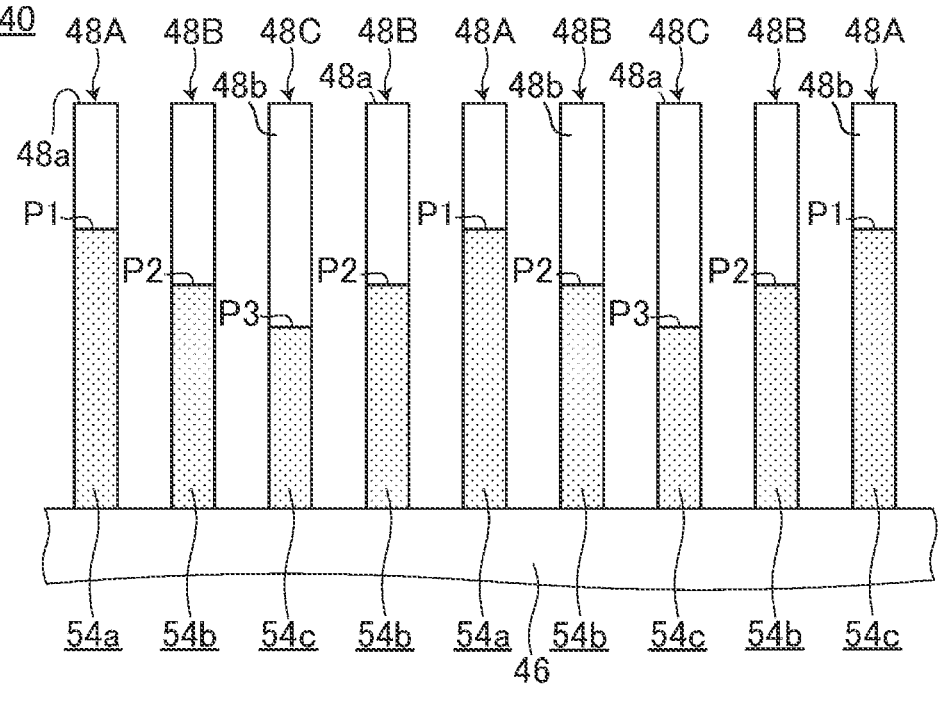
FIG. 7 is a schematic plan view in which a part of the fan has been laid out to arrange the blades in parallel.

FIG. 7 is a schematic plan view in which a part of the fan 40 has been laid out to arrange the blades 48 in parallel. In FIG. 7, the inclined portions 54a to 54c are indicated by a dot pattern.

As illustrated in FIG. 3 to FIG. 7, in the inclined portions 54a to 54c, the positions of start points P1 to P3, at which the inclined portions start to incline, are different in the direction from the tips of the end surfaces 48b toward the motor section 46. The start point P1 of the inclined portion 54a is positioned closer to the tip 48a than the start points P2 and P3 of the inclined portions 54b, 54c. On the other hand, the start point P3 of the inclined portion 54c is positioned farther from the tip 48a than the start points P1 and P2 of the inclined portions 54a, 54b, that is, closer to the root. Therefore, the start point P2 of the inclined portion 54b lies between the start point P1 and the start point P3. Consequently, the lengths in the direction from the tips 48a of the blades 48 toward the motor section 46 are longer in the order of the inclined portions 54a, 54b, and 54c.

Thus, the fan 40 includes a first blade group 48A in which the inclined portions 54a having the start point P1 are formed, a second blade group 48B in which the inclined portions 54b having the start point P2 are formed, and a third blade group 48C in which the inclined portions 54c having the start point P3 are formed. Each of the blade groups 48A to 48C is composed of the plurality of blades 48. In the case of the present embodiment, the number of blades 48 constituting each of the blade groups 48A to 48C is the same, namely, 18 (refer to FIG. 6). The number of the blades 48 constituting each of the blade groups 48A to 48C may be different. However, for the noise reduction effect, which will be described later, it is preferable that the number of the blades 48 constituting each of the blade groups 48A to 48C is the same, and all the blades 48 constituting the fan 40 are evenly arranged.

In the configuration example illustrated in FIG. 4 to FIG. 7, the blades 48 constituting each of the blade groups 48A to 48C are arranged one by one in order. More specifically, the blades 48 are arranged such that the blade 48 of the second blade group 48B is placed adjacently to the blade 48 of the first blade group 48A, the blade 48 of the third blade group 48C is placed adjacently to the blade 48 of the second blade group 48B.

A virtual line VL indicated by the thick line in FIG. 6 denotes a trajectory passing through the start points P1 to P3 of the blades 48 in order. The virtual line VL illustrated in FIG. 6 draws a wavily distorted circular arc shape, and has a shape that can be called a substantially circular saw-tooth shape or a substantially gear shape.

Referring now to Table 1, a description will be given of the experiment results of the comparison between the centrifugal fans 38, 39 of the embodiment provided with the blades 48 having the inclined portions 54a to 54c, the start points P1 to P3 of which are shifted in position as described above, and a centrifugal fan of a comparative example provided with blades of a conventional configuration without the inclined portions 54a to 54c having the positionally shifted start points P1 to P3.

The experiments were performed using the cooling module 22 illustrated in FIG. 2. The centrifugal fan of the comparative example used for the experiments had the same specifications as those of the centrifugal fans 38, 39 of the embodiment except for the inclined portions 54a to 54c. Further, for the centrifugal fans of the embodiment and the comparative example, the rotation speed (rpm) of the fan 40 was measured, with noise set constant at "45 dB," "42 dB," "38 dB," "32 dB," and "28 dB." In Table 1, "CPU" indicates the measurement results of the centrifugal fan 39 for mainly cooling the CPU 30, and "GPU" indicates the measurement results of the centrifugal fan 38 for mainly cooling the GPU 31. Further, in Table 1, "A" denotes the increasing rate of the rotation speed of the embodiment relative to the rotation speed of the comparative example, which was calculated for each set noise by averaging the results of "CPU" and "GPU."

As indicated in Table 1, according to the experiment results, the centrifugal fans 38, 39 of the embodiment showed an increase in the rotation speed of the fan 40 at each set noise, with a maximum increase of 6%, as compared with the centrifugal fan of the comparative example. As described above, it was found that the centrifugal fans 38, 39 of the embodiment reduce noise and improve quietness, as compared with the centrifugal fan of the comparative example at the same rotation speed.

the air volume, as compared with the conventional centrifugal fan, for the same noise. Therefore, the electronic apparatus 10 provided with the above-described centrifugal fan 38 (39) can improve the cooling performance for the same noise so as to improve the performance of the CPU 30, and the like, and the quietness for the same cooling performance can be improved.

As illustrated in FIG. 3, the centrifugal fan 38 (39) has the intake ports 42a, 42b in the upper and the lower surfaces. The inclined portions 54a to 54c are preferably provided on the end surfaces 48b facing the intake port 42b, which faces the chassis intake ports 14Ba, which open in the bottom surface of the chassis 14. This is because the intake port 42b, which directly draws in air from outside the chassis 14, has a larger intake volume than the intake port 42a, which draws in air from the inside of the chassis 14, so that the inclined portions 54a to 54c exhibit a greater noise reduction effect. In the case of the centrifugal fan 38 (39) of such a double-sided intake type, the inclined portions 54a to 54c may be provided on the upper and the lower end surfaces, or only on one surface.

Figure 8:
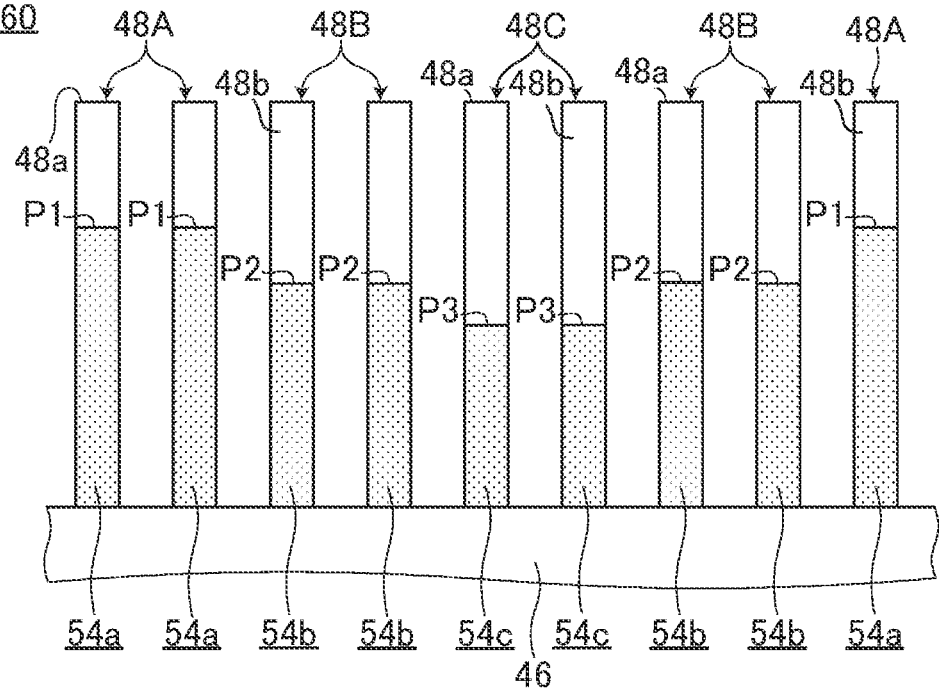
FIG. 8 is a schematic plan view in which a part of a fan according to a first modified example has been laid out to arrange the blades in parallel.

FIG. 8 is a schematic plan view illustrating a part of a fan 60 according to a first modified example that has been laid out to arrange blades 48 in parallel. In the fan 60 according to this modified example, the elements having the same or similar functions and effects as or to those of the above-described fan 40 will be assigned the same symbols, and detailed descriptions thereof will be omitted. The same will apply to a fan 62 illustrated in FIG. 9.

TABLE 1

| | | Set Noise | | | | | |
| --- | --- | --- | --- | --- | --- | --- | --- |
| | | 45 dB | 42 dB | 38 dB | 35 dB | 32 dB | 28 dB |
| Comparative | CPU | 5700 | 5100 | 4400 | 4000 | 3650 | 3250 |
| Example | GPU | 5100 | 4600 | 4000 | 3650 | 3350 | 3000 |
| (rpm) | | | | | | | |
| Embodiment | CPU | 5950 | 5300 | 4750 | 4200 | 3800 | 3300 |
| (rpm) | GPU | 5350 | 4800 | 4150 | 3800 | 3500 | 3050 |
| | A | 4.6% | 4.1% | 6.0% | 4.6% | 4.3% | 1.6% |

As described above, in the centrifugal fan 38 (39) of the present embodiment, the end surfaces 48b of the plurality of blades 48, which face the intake port 42b, are provided with the inclined portions 54a to 54c, which are shaped in such a manner as to incline toward the motor section 46. Thus, the fan 40 has the recessed portion 52 formed by concaving the entire assembly of the end surfaces 48b of the plurality of blades 48 like a mortar on the inner side of the intake port 42b. In addition, the plurality of blades 48 include the plurality of blade groups 48A to 48C that differ in the position of the start points P1 to P3 at which the inclined portions 54a to 54c start to incline in the direction from the tips 48a toward the motor section 46. In this case, it can also be said that the centrifugal fan 38 (39) includes the plurality of blade groups 48A to 48C having different lengths of the inclined portions 54a to 54c in the direction from the tips 48a of the blades 48 toward the motor section 46. Further, it can also be said that the centrifugal fan 38 (39) has a configuration in which the blades 48, 48 that are adjacent to each other have different positions of the start points P1 to P3.

Thus, it was found that the centrifugal fan 38 (39) can suppress the generation of noise, as compared with the conventional centrifugal fan. As a result, the centrifugal fan 38 (39) can increase the rotation speed thereby to increase The fan 60 illustrated in FIG. 8 differs from the fan 40 illustrated in FIG. 4 to FIG. 7 in the arrangement of blades 48 constituting each of blade groups 48A to 48C. More specifically, in the fan 40, the blades 48 constituting each of the blade groups 48A to 48C are arranged one by one in order. On the other hand, in the fan 60, the blades 48 constituting each of the blade groups 48A to 48C are arranged two by two in order. In the fan 60, the blades 48 constituting each of the blade groups 48A to 48C may be arranged three by three or more. The centrifugal fan 38 (39) provided with the above-described fan 60 can also suppress the generation of noise in the same manner as the configuration having the above-described fan 40.

Figure 9:
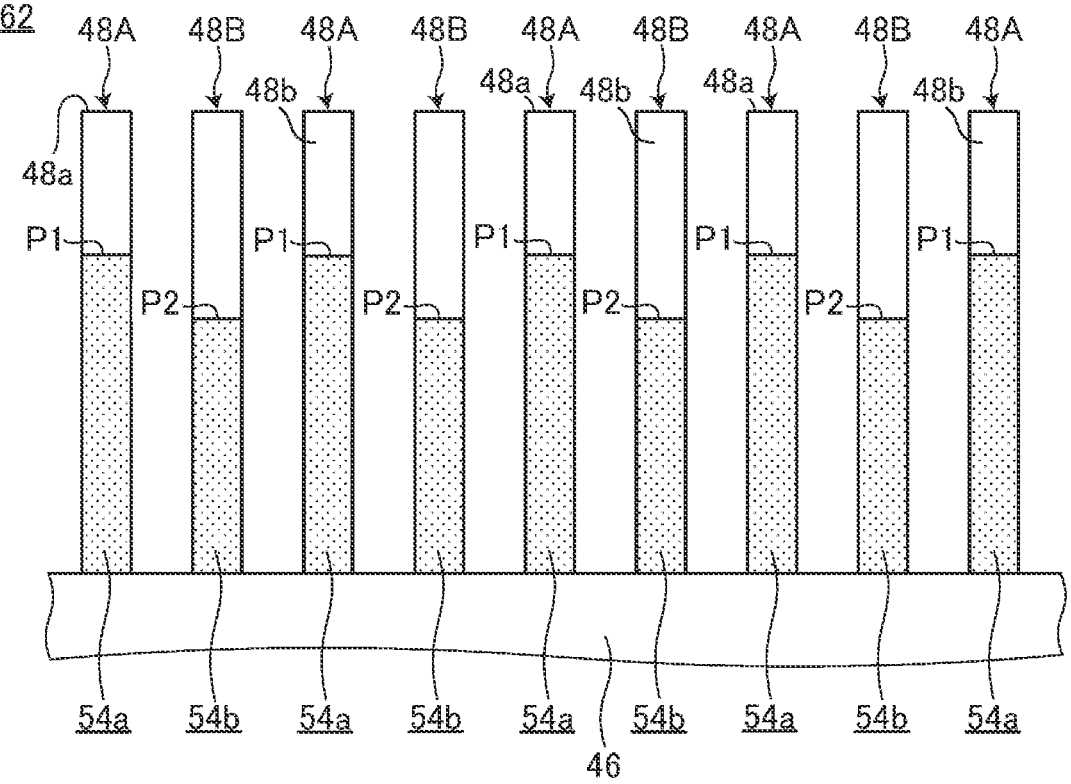
FIG. 9 is a schematic plan view in which a part of a fan according to a second modified example has been laid out to arrange the blades in parallel.

FIG. 9 is a schematic plan view in which a part of a fan 62 according to a second modified example has been laid out to arrange blades 48 in parallel.

The fan 62 illustrated in FIG. 9 differs from the fan 40 illustrated in FIG. 4 to FIG. 7 in the absence of the third blade group 48C. More specifically, the fan 62 has a configuration in which blades 48 constituting a first and a second blade groups 48A and 48B are arranged one by one in order. In the fan 62 also, the blades 48 constituting each of the blade groups 48A and 48B may be arranged two by two or more, as with the fan 60 illustrated in FIG. 8. Thus, the centrifugal fan 38 (39) may have a configuration that includes two types of inclined portions 54a, 54b.

In the centrifugal fan 38 (39), four or more types of inclined portions may be used rather than three or two types described above, and the arrangement may be other than those illustrated in FIG. 7 to FIG. 9. In selecting these, optimal ones can be selected as appropriate according to the specifications, application, and the like of a centrifugal fan.

It is needless to say that the present invention is not limited to the above-described embodiment, and modifications can be freely made within a range not departing from the gist of the present invention.

DESCRIPTION OF SYMBOLS

10 electronic apparatus
14 chassis
14Ba chassis intake port
22 cooling module
30 CPU
31 GPU
38, 39 centrifugal fan
40, 60, 62 fan
42 casing
42*a*, 42*b* intake port
42*c* exhaust port
46 motor section
48 blade
48A first blade group
48B second blade group
48C third blade group
54*a* to 54*c* inclined portion
P1 to P3 start point

The invention claimed is:

1. A centrifugal fan comprising:
a fan having a motor that rotates around a central axis and a plurality of blades provided on an outer periphery of the motor; and
a casing accommodating the fan and having an intake port provided in an axial direction of the central axis and an exhaust port provided in a direction orthogonal to the central axis, wherein
an end surface of each of the plurality of blades that faces the intake port is provided with an inclined portion that inclines such that a height thereof in the axial direction gradually decreases toward the motor, the plurality of blades include a plurality of blade groups having different start point positions at which the inclined portions start to incline in a direction from tips of the blades toward the motor, and
the blades of each blade group are arranged two by two in order.

2. The centrifugal fan according to claim 1, wherein the plurality of blade groups include a first blade group, a second blade group, and a third blade group that have different start point positions.

3. An electronic apparatus comprising:
a chassis;
a heating element provided in the chassis; and
a cooling module which is provided in the chassis and absorbs heat generated by the heating element, wherein
the cooling module includes:
the centrifugal fan according to claim 1;
a fin, facing the exhaust port; and
a heat transport device which transports the heat generated by the heating element to the fin.

4. The electronic apparatus according to claim 3, wherein
the chassis has a chassis intake port which opens at a bottom surface of the chassis, and
the intake port faces the chassis intake port.

5. A centrifugal fan comprising:
a fan having a motor that rotates around a central axis and a plurality of blades provided on an outer periphery of the motor; and
a casing accommodating the fan and having an intake port provided in an axial direction of the central axis and an exhaust port provided in a direction orthogonal to the central axis, wherein
an end surface of each of the plurality of blades that faces the intake port is provided with an inclined portion that inclines such that a height thereof in the axial direction gradually decreases toward the motor,
the plurality of blades include a plurality of blade groups in which lengths of the inclined portions in a direction from tips of the blades toward the motor are different, and
the blades of each blade group are arranged two by two in order.

* * * * *